United States Patent
Kux et al.

(10) Patent No.: US 6,853,085 B2
(45) Date of Patent: Feb. 8, 2005

(54) METHOD AND DEVICE FOR SECURING A MULTI-DIMENSIONALLY CONSTRUCTED CHIP STACK AND CHIP CONFIGURATION

(75) Inventors: Andreas Kux, Haar (DE); Michael Smola, München (DE)

(73) Assignee: Infineon Technologies AG, Munich (DE)

( * ) Notice: Subject to any disclaimer, the term of this patent is extended or adjusted under 35 U.S.C. 154(b) by 228 days.

(21) Appl. No.: 10/002,925

(22) Filed: Nov. 2, 2001

(65) Prior Publication Data

US 2003/0008432 A1 Jan. 9, 2003

Related U.S. Application Data

(63) Continuation of application No. PCT/EP00/03834, filed on Apr. 27, 2000.

(30) Foreign Application Priority Data

May 3, 1999 (EP) .............................................. 99108768

(51) Int. Cl.[7] .......................... H01L 23/48; H01L 23/52; H01L 29/40; H01L 21/44; H01L 21/48
(52) U.S. Cl. ....................................... 257/777; 438/109
(58) Field of Search ........................... 257/777; 438/109

(56) References Cited

U.S. PATENT DOCUMENTS

| 5,106,773 A | * | 4/1992 | Chen et al. ............... 438/131 |
| 5,196,920 A | * | 3/1993 | Kumamoto et al. ........ 257/798 |
| 5,229,647 A | | 7/1993 | Gnadinger |
| 5,701,037 A | * | 12/1997 | Weber et al. ............... 257/777 |
| 5,818,112 A | * | 10/1998 | Weber et al. ............... 257/777 |
| 5,936,302 A | * | 8/1999 | Pedersen et al. ........... 257/665 |
| 6,434,712 B1 | * | 8/2002 | Urban et al. ................ 714/12 |

FOREIGN PATENT DOCUMENTS

| DE | 44 27 515 C1 | 8/1995 |
| EP | 0 221 351 A1 | 5/1987 |
| EP | 0 510 433 A2 | 10/1992 |
| JP | 61203656 | 9/1986 |
| WO | WO 96/31101 | 10/1996 |

OTHER PUBLICATIONS

International Search Report for PCT/EP00/03834, issued by the European Patent Office on Jul. 31, 2000.

* cited by examiner

Primary Examiner—Carl Whitehead, Jr.
Assistant Examiner—Nema Berezny
(74) Attorney, Agent, or Firm—Laurence A. Greenberg; Werner H. Stemer; Gregory L. Mayback

(57) ABSTRACT

A method for securing a multi-dimensionally constructed chip stack, which has a plurality of part chips which are interconnected at respective contact areas and of which at least one contains functional components, includes the steps of providing respective conductor tracks in the part chips and providing feed-through contacts at the respective contact areas, which in each case interconnect conductor tracks of various part chips so that a continuous electrical signal path running through the part chips is formed. An electrical signal is transmitted from a transmitting device provided at a first end of the electrical signal path to a receiving device provided at a second end of the electrical signal path. When the electrical signal cannot be received, it is determined that the chip stack has been damaged. A device for securing a chip stack and a chip configuration are also provided.

19 Claims, 3 Drawing Sheets

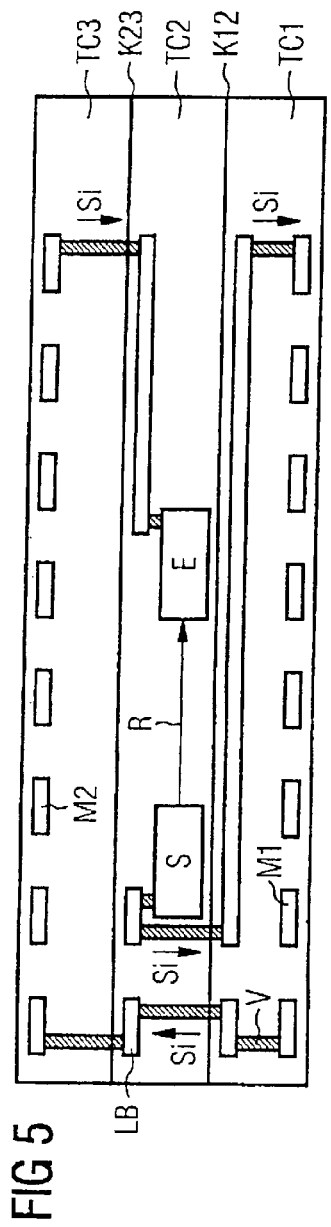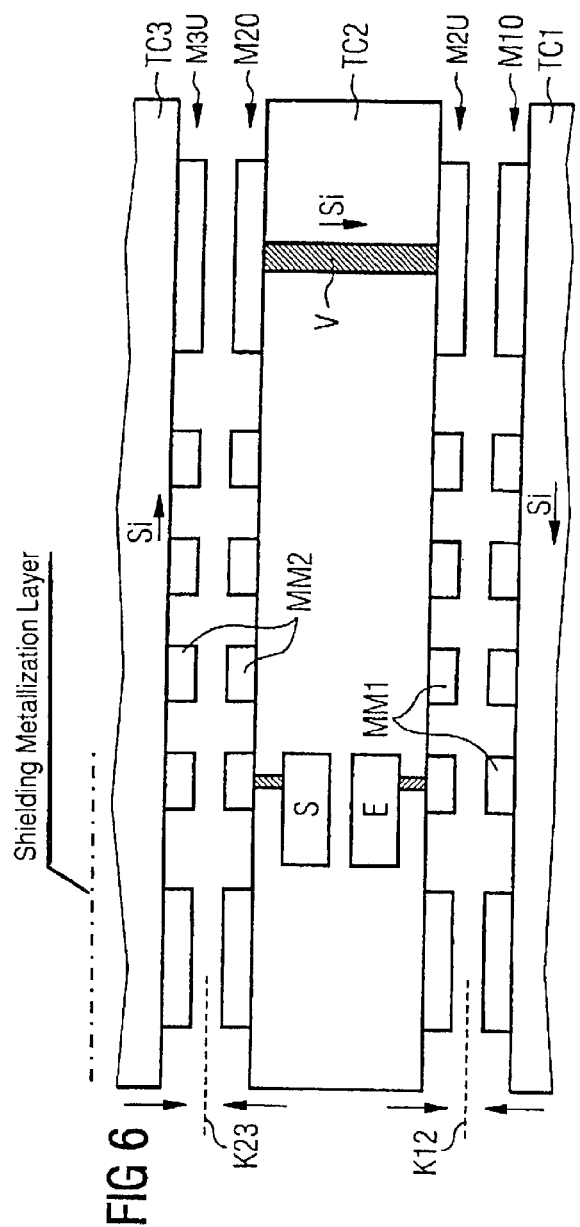

METHOD AND DEVICE FOR SECURING A MULTI-DIMENSIONALLY CONSTRUCTED CHIP STACK AND CHIP CONFIGURATION

CROSS-REFERENCE TO RELATED APPLICATION

This application is a continuation of copending International Application No. PCT/EP00/03834, filed Apr. 27, 2000, which designated the United States.

BACKGROUND OF THE INVENTION

FIELD OF THE INVENTION

The invention relates to a method and a device for securing a multi-dimensionally constructed chip stack, which has a plurality of part chips connected to one another at respective contact areas. At least one of the part chips includes appropriate functional components.

In this case, functional components are to be understood as micro-electronic circuits or micro-mechanical components of any type integrated into the part chips. A chip can be understood to be, for example, a wafer or a part of a wafer made of a semiconductor material or another suitable material.

The problem on which the present invention is based is to ensure, in such a chip stack, that the connection between the individual part chips at the respective contact areas cannot be undone or detached without such a damage being detected by an appropriate functional component. If such a damage can be determined, appropriate counter measures can be taken which, for example, prevent further operation of one or more functional components.

Hitherto, little consideration has been given to the problem of securing a multi-dimensionally constructed chip stack, since three-dimensional chip connections are not yet in widespread use.

SUMMARY OF THE INVENTION

It is accordingly an object of the invention to provide a method and a device for securing a multi-dimensionally constructed chip stack which overcomes the above-mentioned disadvantages of the heretofore-known methods and devices of this general type and which are able to make physical attacks on critical security chips, such as smart cards or code cards, detectable. In particular, dividing the chip stack in order to make access to parts of the chip should be detectable.

With the foregoing and other objects in view there is provided, in accordance with the invention, a method of securing a multi-dimensionally constructed chip stack, the method includes the steps of: providing a chip stack having a plurality of part chips connected to one another at respective contact areas, at least one of the part chips including functional components;

providing respective conductor tracks in the part chips;

providing feed-through contacts at the respective contact areas for interconnecting the conductor tracks in the part chips such that that a continuous electrical signal path running through the part chips is formed;

transmitting an electrical signal from a transmitting device provided at a first end of the continuous electrical signal path to a receiving device provided at a second end of the continuous electrical signal path;

providing a continuous electrical reference signal path running from the transmitting device to the receiving device;

transmitting an electrical reference signal over the continuous electrical reference signal path at the same time as the electrical signal is transmitted; and determining a damage to the chip stack when the electrical signal cannot be received.

The present invention is based on the idea of integrating a multi-dimensional meandering line into the chip composite, through which, continuously or at specific time intervals, electrical signals are transmitted from a first point to a second point. In the simplest case, if the signals arrive at the second point or arrive unchanged, it is possible to draw conclusions from this relating to the intactness of the signal path located between them. In relation to the respective part chip, vertical feed-through contacts or plated-through holes are used for the purpose of connecting planar conductor track patterns of different part chips and, in this way, to provide a signal path running through all the part chips mounted one above another.

This has the advantage that the integration of the security device according to the invention can be carried out within the context of conventional process steps, in particular metallization and through-hole plating.

According to the invention, a continuous electrical reference signal path running from the transmitting device to the receiving device is formed, and an electrical reference signal is transmitted over the path at the same time as the electrical signal is transmitted. This ensures that no artificial transmitter can be used instead of the real transmitter to confuse the receiver.

According to a preferred mode of the invention, one or more functional components are deactivated if damage to the chip stack is determined. It is thus possible to prevent unauthorized persons from looking at information that is to be kept secret.

According to a further preferred mode of the invention, the transmitting device and the receiving device are provided in different part chips. Therefore, the transmitter and the receiver cannot be short-circuited via a link in the same part chip.

According to a further preferred mode of the invention, a plurality of pairs of transmitting devices and receiving devices are provided in different part chips. It is thus possible for the part chips to check one another.

With the objects of the invention in view there is also provided, in combination with a multi-dimensionally constructed chip stack including a plurality of part chips having respective contact areas, the part chips including functional components and being connected to one another at the respective contact areas, a device for securing the multi-dimensionally constructed chip stack, including:

conductor tracks provided in respective ones of the part chips;

feed-through contacts provided at the respective contact areas, the feed-through contacts interconnecting the conductor tracks of different ones of the part chips such that a continuous electrical signal path extending through the part chips is formed, the continuous electrical signal path having a first end and a second end;

a transmitting device provided at the first end of the continuous electrical signal path;

a receiving device provided at the second end of the continuous electrical signal path, the receiving device being configured to receive an electrical signal transmitted via the continuous electrical signal path;

a continuous electrical reference signal path extending from the transmitting device to the receiving device; and a determining device operatively connected to the receiving device, the determining device determining that there is a damage to the multi-dimensionally constructed chip stack if the electrical signal cannot be received.

According to a preferred feature of the invention, the respective conductor tracks in the part chips are of planar configuration. In this way, metallization layers which are present in any case can be used for the security device.

According to a further preferred feature of the invention, conductor tracks are formed between the part chips in a metallization layer used to connect two part chips in each case. The metal layer for the vertical connection, for example a soldered connection, thus fulfills a dual function.

According to a further preferred feature of the invention, in particular for the case in which part chips are connected via structured solder metal, a metallization layer without a connecting function is provided on one side as a shielding on a part chip located on the outside.

According to a further preferred feature of the invention, the signal path is formed so as to run vertically in a meandering way through the part chips. In the simplest case, the meander is formed in a vertical plane. However, more complicated three-dimensional shapes corresponding to the respective chip division are possible.

According to a further preferred feature of the invention, conductor tracks are formed as planar meandering shapes in one or more part chips, in particular at the end faces of the chip stack. This permits close-meshed shielding to be achieved on relatively large free surface areas.

Other features which are considered as characteristic for the invention are set forth in the appended claims.

Although the invention is illustrated and described herein as embodied in a method and device for securing a multi-dimensionally constructed chip stack, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a schematic illustration of a chip stack constructed from three part chips and having a security device according to a fifth exemplary embodiment of the invention; and FIG. 6 is a schematic illustration of a chip stack constructed from three part chips and having a security device according to a sixth exemplary embodiment of the invention.

DESCRIPTION OF THE PREFERRED EMBODIMENTS

Figure 1:
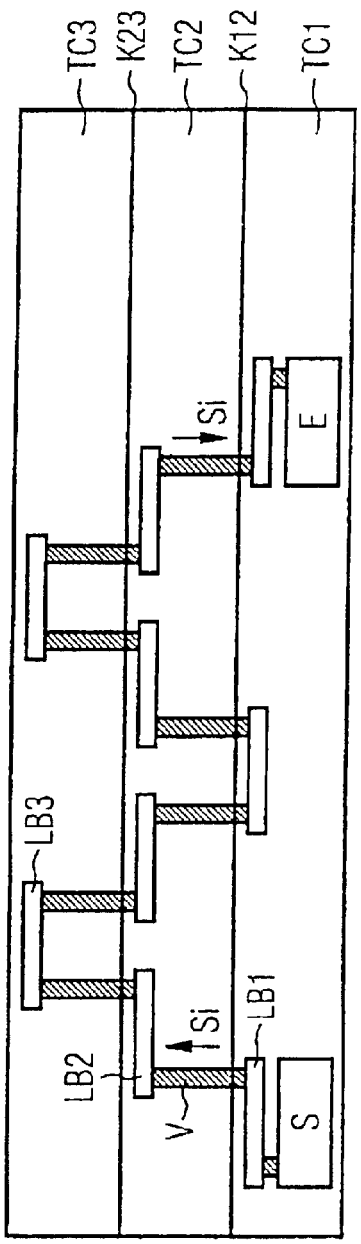
FIG. 1 is a schematic illustration of a chip stack constructed from three part chips and having a security device according to a first exemplary embodiment of the invention.

Referring now to the figures of the drawings in detail and first, particularly, to FIG. 1 thereof, there is shown a schematic illustration of a chip stack constructed from three part chips, having a securing device according to a first exemplary embodiment of the invention. In the figures, identical reference symbols designate identical or functionally identical elements. In FIG. 1, TC1, TC2, TC3 designate a first, second and third part chip which are connected (for example soldered) to one another in the form of a stack at respective contact areas K12, K23. The respective part chips contain security-sensitive functional components which, for reasons of simplicity, are not illustrated in the figures.

LB1, LB2 and LB3 designate conductor tracks which are provided in the corresponding part chips TC1, TC2, TC3, which are created using known planar technology and, in the example shown, are buried under the respective surface of the relevant part chip (for example under an insulating layer).

In order to connect the conductor tracks, feed-through contacts or plated-through holes V (vias with a conductive filling) through the part chips TC1, TC2, TC3 are provided, which ensure that a continuous electrical signal path running through all the part chips is formed. Provided at a first end of the electrical signal path is a transmitting device S, and a receiving device E is provided at a second end of the electrical signal path.

For securing the multi-dimensional chip stack constructed in this way, during operation an electrical signal is led from the transmitting device S to the receiving device E at regular intervals, for example in a one-second cycle. The receiving device contains an intelligent circuit or determining circuit, which is only schematically shown in FIG. 2 and which determines that there is damage to the chip stack if the electrical signal Si cannot be received in the receiving device E. This determining device further ensures that security-relevant functional components in the part chips TC1, TC2, TC3 are deactivated if damage to the chip stack is determined. For example, such deactivation may be the deletion of memory contents of memory components. The deactivation may be performed by a deactivation device which is schematically indicated in FIG. 2.

The type of electrical signal is substantially as desired. It needs only to be a pattern whose structure is known to the receiver.

The continuous signal path shown in FIG. 1 has the form of a meander lying in a vertical plane. In order to extend the security into the third dimension, if required, either a plurality of such security devices can be used beside one another or the conductor tracks in the respective part chip can be constructed so as to run into the third dimension (depth).

Figure 2:
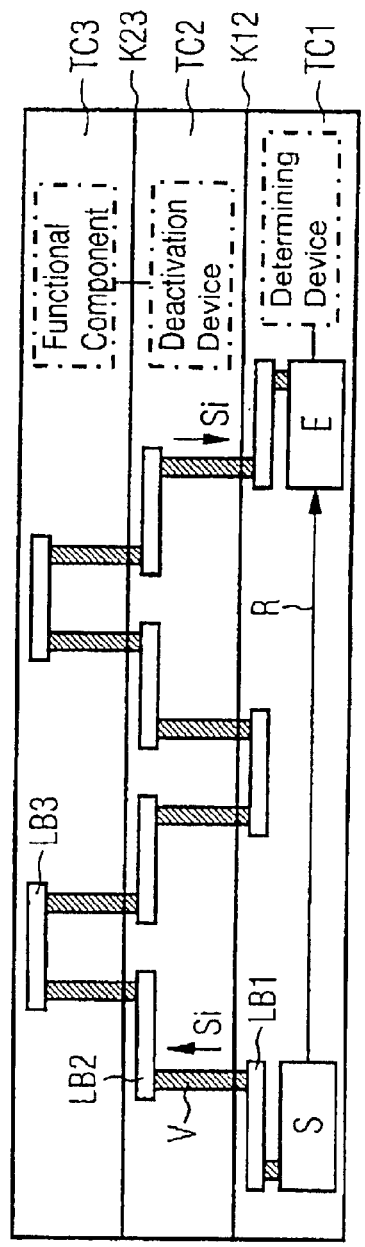
FIG. 2 is a schematic illustration of a chip stack constructed from three part chips and having a security device according to a second exemplary embodiment of the invention.

FIG. 2 is a schematic illustration of a chip stack constructed from three part chips, having a security device according to a second exemplary embodiment of the present invention.

In the second embodiment, shown in FIG. 2, a continuous electrical reference signal path running from the transmitting device S to the receiving device E is additionally formed over which path an electrical reference signal R is transmitted at the same time as the electrical signal Si is transmitted. Thus, the criterion for the intactness of the chip stack is not only the pure ability to receive the signal Si at the receiver, but also the simultaneous ability to receive the reference signal R. It is therefore possible to ensure that no artificial transmitting device can be used instead of the real transmitting device S to confuse the receiving device E.

It should be mentioned that the reference signal path can be constructed in a similar way to the first signal path, using conductor tracks and feed-through contacts, and is shown here only as a schematic line merely for reasons of simplification.

Figure 3:
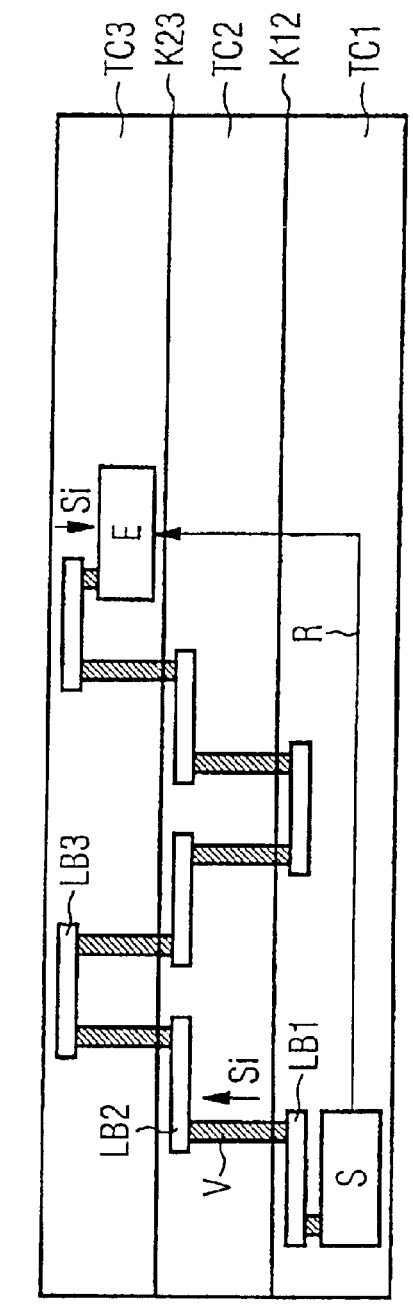
FIG. 3 is a schematic illustration of a chip stack constructed from three part chips and having a security device according to a third exemplary embodiment of the invention.

FIG. 3 is a schematic illustration of a chip stack constructed from three part chips, having a security device according to a third exemplary embodiment of the present invention.

In the third embodiment, illustrated in FIG. 3, the transmitting device S and the receiving device E are accommodated in different part chips TC1 and TC3, respectively. It is therefore possible to prevent their being short-circuited via a link between feed-through contacts in the part chip TC1.

Figure 4:
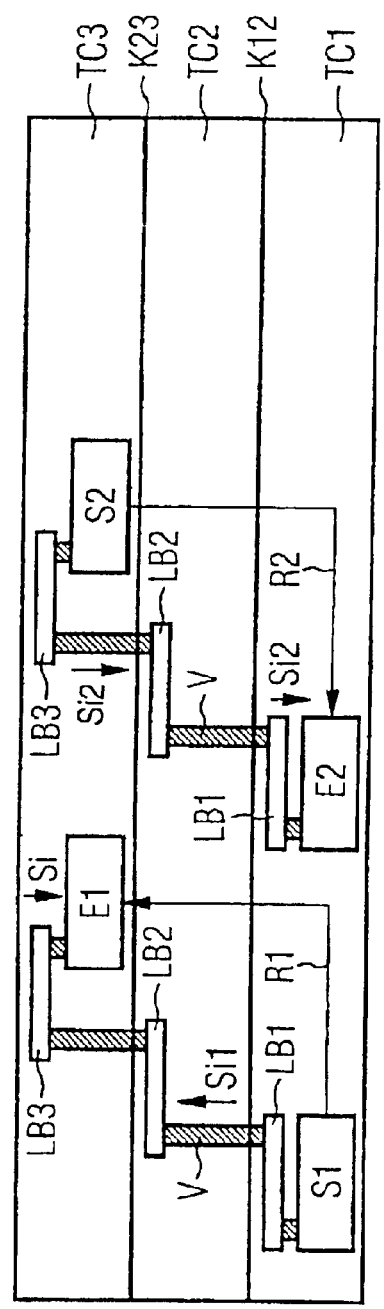
FIG. 4 is a schematic illustration of a chip stack constructed from three part chips and having a security device according to a fourth exemplary embodiment of the invention.

FIG. 4 is a schematic illustration of a chip stack constructed from three part chips, having a security device according to a fourth exemplary embodiment of the present invention.

In the fourth embodiment, shown in FIG. 4, two signal paths each having a transmitting device S1, S2 and a respective receiving device E1, E2 are provided. In this case, the part chips check one another by transmitting the signals Si1, R1 and Si2, R2 in opposite directions. This increases the effectiveness of the security device.

FIG. 5 is a schematic illustration of a chip stack constructed from three part chips, having a security device according to a fifth exemplary embodiment of the present invention.

In the embodiment shown in FIG. 5, the transmitting device S and the receiving device E are accommodated in the central part chip TC2. As opposed to the embodiment described above, in the case of this embodiment, two-dimensional meandering conductor track patterns M1, M2 are incorporated into the signal path. These meandering conductor track patterns are provided on the upper and lower end faces of the chip stack and are used to protect these two large exposed end faces. Otherwise, the function of the security device according to this fifth exemplary embodiment is the same as that of the exemplary embodiments already described above.

FIG. 6 is a schematic illustration of a chip stack constructed from three part chips, having a security device according to a sixth exemplary embodiment of the present invention.

In the embodiment shown in FIG. 6, the three part chips TC1, TC2, TC3 are shown in the state not yet connected to one another, the subsequent contact areas K12, K23 being illustrated schematically as joined by a dashed line and corresponding arrows.

In FIG. 6, M1O designates an upper metallization on the first part chip TC1, M2U designates a lower metallization on the second part chip TC2, M2O designates an upper metallization on the second part chip TC2, and M3U designates a lower metallization on the part chip TC3. The respective opposing metallizations on the contact areas K12 and K23 have the same structure, a respective meandering structure MM1 and MM2 being provided in the center. The sixth embodiment, shown in FIG. 6, makes use of the fact that during the vertical chip connecting method, a conductive layer is produced between the upper and lower part chips if connecting metal, such as solder remains of the corresponding points and is not moved as a result of structuring with a subsequent etching step.

In the case of this embodiment, the metal layer used to connect between the part chips is used for the purpose of forming a respective meandering conductor track pattern MM1 and MM2, which is part of the signal path which runs through all the part chips TC1, TC2, TC3. Thus, structured shielding between the part chips is formed in the areas which are not used directly to make vertical contact. In addition to the elements of the active layer located above, it protects the circuit parts located underneath. Its freedom is limited in a specific way by the necessary adjustment of the part chips in relation to one another. For this purpose, provided the vertical feed-through contacting or through-hole plating is not extremely dense, it is produced without additional expenditure during the vertical integration.

In particular, a solder metal can also be applied to one side of the lower chip, and the circuit can be projected on all sides in this way.

In the sixth embodiment shown, the transmitting device S and the receiving device E are accommodated in the central part chip. The signal path runs upward from the transmitting device S into the meandering conductor track layer MM2, from there, via the feed-through contacts V, into the meandering conductor track layer MM1 and vertically upward from there to the receiving device E.

Although the present invention has been described above using preferred exemplary embodiments, it is not restricted to these, but can be modified in manifold ways. In particular, the present invention is not restricted to three interconnected part chips, but can be used on any desired combination of part chips. In addition, the two-dimensional or three-dimensional configuration of the continuous signal path can be divided up as desired, corresponding to the geometric relationships of the individual chips.

The transmitting device and the receiving device can be located in one of the part chips, but can likewise be provided outside the chips, for example in a mount or clamping device for the chip.

For the case in which, for example for technical reasons, no rear shielding can be applied to the chip, an extra chip having only shielding but without any functional components can be added.

We claim:

1. A method of securing a multi-dimensionally constructed chip stack, the method which comprises:

providing a chip stack having a plurality of part chips connected to one another at respective contact areas, at least one of the part chips including functional components;

providing respective conductor tracks within the part chips;

providing feed-through contacts at the respective contact areas for interconnecting the conductor tracks in the part chips such that that a continuous electrical signal path running through the part chips is formed;

transmitting an electrical signal from a transmitting device provided at a first end of the continuous electrical signal path to a receiving device provided at a second end of the continuous electrical signal path;

providing a continuous electrical reference signal path running from the transimitting device to the receiving device;

transmitting an electrical reference signal over the continuous electrical reference signal path at the same time as the electrical signal is transmitted; and determining a damage to the chip stack by a determining device operatively connected to the receiving device when the electrical signal cannot be received, the determining device ensuring deactivation of security-relevant functional components in the part chips upon determination of damage in the chip stack.

2. The method according to claim 1, which comprises providing the transmitting device and the receiving device in different ones of the part chips.

3. The method according to claim 1, which comprises providing a plurality of pairs of transmitting devices and receiving devices in different ones of the part chips.

4. In combination with a multi-dimensionally constructed chip stack including a plurality of part chips having respective contact areas, the part chips including functional components and being connected to one another at the respective contact areas, a device for securing the multi-dimensionally constructed chip stack, comprising:

conductor tracks provided within respective ones of the part chips;

feed-through contacts provided at the respective contact areas, said feed-through contacts interconnecting said conductor tracks of different ones of the part chips such that a continuous electrical signal path extending through the part chips is formed, said continuous electrical signal path having a first end and a second end;

a transmitting device provided at said first end of said continuous electrical signal path;

a receiving device provided at said second end of said continuous electrical signal path, said receiving device being configured to receive an electrical signal transmitted via said continuous electrical signal path;

a continuous electrical reference signal path extending from said transmitting device to said receiving device; and a determining device operatively connected to said receiving device, said determining device determining that there is a damage to the multi-dimensionally constructed chip stack if the electrical signal cannot be received, said determining device ensuring deactivation of security-relevant functional components in the part chips upon determination of damage in the chip stack.

5. The device according to claim 4, including a deactivation device operatively connected to at least one of the functional components, said deactivation device deactivating at least one of the functional components if said determining device determines that there is a damage to the multi-dimensionally constructed chip stack.

6. The device according to claim 4, wherein said transmitting device and said receiving device are provided in different ones of the part chips.

7. The device according to claim 4, including:

further transmitting devices and further receiving devices respectively provided in different ones of the part chips; and said transmitting device and said receiving device forming a first pair of devices, said further transmitting devices and said further receiving devices forming further pairs of devices.

8. The device according to claim 4, wherein said conductor tracks provided in the part chips are planar conductor tracks.

9. The device according to claim 4, including:

a metallization layer formed between respective two of the part chips; and further conductor tracks formed in said metallization layer for connecting the respective two of the part chips.

10. The device according to claim 4, including a metallization layer provided on a side of an outer one of the part chips, said metallization layer serving as a shield and having no connecting function.

11. The device according to claim 4, wherein said continuous electrical signal path is a meandering path and runs vertically through the part chips.

12. The device according to claim 4, wherein said conductor tracks are configured as planar, meandering conductor tracks in at least one of the part chips.

13. The device according to claim 4, wherein the multi-dimensionally constructed chip stack has end faces and said conductor tracks are planar, meandering conductor tracks provided on the end faces.

14. A chip configuration, comprising:

a multi-dimensionally constructed chip stack including a plurality of part chips having respective contact areas, said part chips including functional components and being connected to one another at said respective contact areas;

a securing device for securing said multi-dimensionally constructed chip stack;

said securing device including conductor tracks provided within respective ones of said part chips, feed-through contacts provided at said respective contact areas, said feed-through contacts interconnecting said conductor tracks of different ones of said part chips such that a continuous electrical signal path extending through said part chips is formed, said continuous electrical signal path having a first end and a second end;

said securing device further including a transmitting device provided at said first end of said continuous electrical signal path, a receiving device provided at said second end of said continuous electrical signal path, said receiving device being configured to receive an electrical signal transmitted via said continuous electrical signal path, a continuous electrical reference signal path extending from said transmitting device to said receiving device, and a determining device operatively connected to said receiving device, said determining device determining that there is a damage to said multi-dimensionally constructed chip stack if the electrical signal cannot be received, said determining device ensuring deactivation of security-relevant functional components in the part chips upon determination of damage in the chip stack.

15. The chip configuration according to claim 14, including a deactivation device operatively connected to at least one of said functional components, said deactivation device deactivating at least one of said functional components if said determining device determines that there is a damage to said multi-dimensionally constructed chip stack.

16. The chip configuration according to claim 14, wherein said transmitting device and said receiving device are provided in different ones of said part chips.

17. The chip configuration according to claim 14, including:

further transmitting devices and further receiving devices respectively provided in different ones of said part chips; and said transmitting device and said receiving device forming a first pair of devices, said further transmitting devices and said further receiving devices forming further pairs of devices.

18. The chip configuration according to claim 14, wherein said conductor tracks provided in said part chips are planar conductor tracks.

19. The chip configuration according to claim 14, including:
a metallization layer formed between respective two of said part chips; and
further conductor tracks formed in said metallization layer for connecting said respective two of said part chips.

* * * * *